United States Patent
Liao et al.

(10) Patent No.: US 9,123,744 B1
(45) Date of Patent: Sep. 1, 2015

(54) SEMICONDUCTOR DEVICE AND METHOD FOR FABRICATING THE SAME

(71) Applicant: United Microelectronics Corp., Hsinchu (TW)

(72) Inventors: Chin-I Liao, Tainan (TW); Sheng-Hsu Liu, Changhua County (TW)

(73) Assignee: United Microelectronics Corp., Hsinchu (TW)

( * ) Notice: Subject to any disclaimer, the term of this patent is extended or adjusted under 35 U.S.C. 154(b) by 0 days.

(21) Appl. No.: 14/201,373

(22) Filed: Mar. 7, 2014

(51) Int. Cl.
| | |
|---|---|
| *H01L 29/76* | (2006.01) |
| *H01L 29/66* | (2006.01) |
| *H01L 29/78* | (2006.01) |
| *H01L 21/02* | (2006.01) |
| *H01L 29/16* | (2006.01) |
| *H01L 29/161* | (2006.01) |
| *H01L 29/24* | (2006.01) |

(52) U.S. Cl.
CPC ...... *H01L 29/66553* (2013.01); *H01L 21/0217* (2013.01); *H01L 21/02521* (2013.01); *H01L 21/02532* (2013.01); *H01L 29/16* (2013.01); *H01L 29/161* (2013.01); *H01L 29/24* (2013.01); *H01L 29/6653* (2013.01); *H01L 29/66795* (2013.01); *H01L 29/7851* (2013.01); *H01L 29/7853* (2013.01)

(58) Field of Classification Search
USPC .......................................... 257/288; 438/197
See application file for complete search history.

(56) References Cited

U.S. PATENT DOCUMENTS

| | | | |
|---|---|---|---|
| 2008/0003755 A1 | 1/2008 | Shah et al. | |
| 2013/0330898 A1 | 12/2013 | Liao et al. | |
| 2015/0048453 A1* | 2/2015 | Ching et al. | ................. 257/347 |

OTHER PUBLICATIONS

Chin-I Liao et al., "Epitaxial structure and process thereof for non-planar transistor," Unpublished U.S. Appl. No. 14/070,596, filed Nov. 14, 2013.

* cited by examiner

*Primary Examiner* — Asok K Sarkar
(74) *Attorney, Agent, or Firm* — J.C. Patents

(57) ABSTRACT

A method for fabricating a semiconductor device is described. A spacer is formed on a sidewall of a fin structure. A portion of the fin structure is removed to form a cavity exposing at least a portion of the inner sidewall of the spacer. An epitaxy process is performed based on the remaining fin structure to form a semiconductor layer that has a shovel-shaped cross section including: a stem portion in the cavity, and a shovel plane portion contiguous with the stem portion. A semiconductor device is also described, which includes the spacer, the remaining fin structure and the semiconductor layer that are mentioned above.

21 Claims, 2 Drawing Sheets

SEMICONDUCTOR DEVICE AND METHOD FOR FABRICATING THE SAME

BACKGROUND OF THE INVENTION

1. Field of Invention

This invention relates to a semiconductor process and a product thereof, and particularly relates to a method for fabricating a semiconductor device, and to a semiconductor device and a structure of a semiconductor layer made by the method.

2. Description of Related Art

A FinFET typically includes a semiconductor fin, a gate crossing over the fin to form a tri-gate structure, and a source and a drain beside the portion of the fin under the gate. In a strained silicon process applied to FinFET, the portions of the fin not under the gate are recessed after the gate is formed, and a semiconductor compound having a lattice parameter different from that of the material of the fin is grown based on the recessed portions of the fin to serve as a source and a drain.

Because the fin structure usually protrudes from the isolation layer, the top of the recessed fin is near the isolation layer, so the semiconductor compound layer easily touches the isolation layer and becomes asymmetric.

Moreover, when the semiconductor compound layer includes silicon-phosphorus (SiP) and SiP is deposited in the epitaxy process, many dislocations in <111> direction occur due to competition of phosphorus and chlorine in the epitaxy process. Hence, there is concern on issues of device degradation, drain-induced barrier lowering (DIBL), self-aligned contact (SAC) and so on.

SUMMARY OF THE INVENTION

Accordingly, this invention provides a method for fabricating a semiconductor device, which is capable of preventing the above problems.

This invention also provides a semiconductor device fabricated by the method.

This invention also provides a structure of a semiconductor layer formed by the method.

The method for fabricating a semiconductor device of this invention is described below. A spacer is formed on a sidewall of a fin structure. A portion of the fin structure is removed to form a cavity exposing at least a portion of the inner sidewall of the spacer. An epitaxy process is performed based on the remaining fin structure to form thereon a semiconductor layer that has a shovel-shaped cross section including: a stem portion in the cavity, and a shovel plane portion contiguous with the stem portion.

In an embodiment, the reaction gas introduced in the epitaxy process contains a silicon source gas for Si epitaxy. The reaction gas may further contain a phosphorus source gas or a germanium source gas for SiP epitaxy or SiGe epitaxy.

The semiconductor device of this invention includes a fin structure, a spacer and a semiconductor layer. The spacer is at both sides of the fin structure, and defines a cavity together with the fin structure. The semiconductor layer is on the fin structure, and has a shovel-shaped cross section including: a stem portion in the cavity and connected with the fin, and a shovel plane portion contiguous with the stem portion.

In some embodiments, the shovel plane portion covers a portion of the sidewall of the spacer.

The structure of a semiconductor layer of this invention has a shovel-shaped cross section including: a stem portion, and a shovel plane portion being contiguous with the stem portion and defining a spade shape together with the stem portion.

Because the fin structure and the epitaxial growth of the semiconductor layer can be spaced from the isolation layer by the spacer in the method for fabricating a semiconductor device of this invention, the semiconductor layer does not easily touch the isolation layer and hence becomes more symmetric.

Moreover, when the semiconductor layer includes SiP and SiP is deposited in the epitaxy process, the growth of (110) and (111) surfaces of silicon are blocked by the spacer at an initial stage of the epitaxy, so that a dislocation in <111> direction does not easily occur. As a result, the concern on issues of device degradation, DIBL, SAC and so on can be reduced.

In order to make the aforementioned and other objects, features and advantages of the present invention comprehensible, a preferred embodiment accompanied with figures is described in detail below.

BRIEF DESCRIPTION OF THE DRAWINGS

FIGS. 1, 2, 3 and 4A/4B schematically illustrate, in a perspective view (FIGS. 1 and 2) or an A-A' cross-sectional view (FIGS. 3 and 4A/4B), a method for fabricating a semiconductor device according to an embodiment of this invention, wherein FIG. 4A or 4B illustrates the resulting semiconductor device in a case where the shovel plane portion of the semiconductor layer covers or does not cover a portion of a sidewall of the spacer.

DESCRIPTION OF EMBODIMENTS

This invention will be further explained with the following embodiment and the accompanying drawings, which are not intended to restrict the scope of this invention. For example, although in the following embodiment the semiconductor fin structure is connected to a semiconductor substrate below the isolation layer, the fin structure may not be connected to a semiconductor substrate below the isolation layer in other embodiments, e.g., an embodiment where the fin is defined from a SOI substrate.

Figure 2:
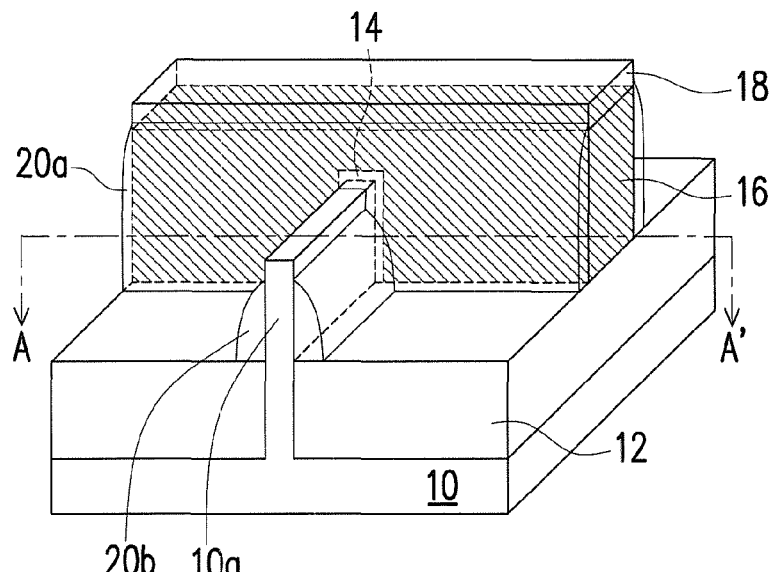
Figure 3:
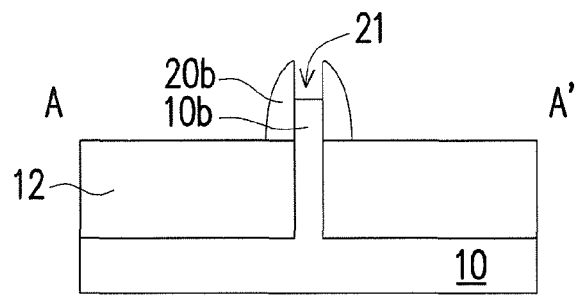
Figure 4A:
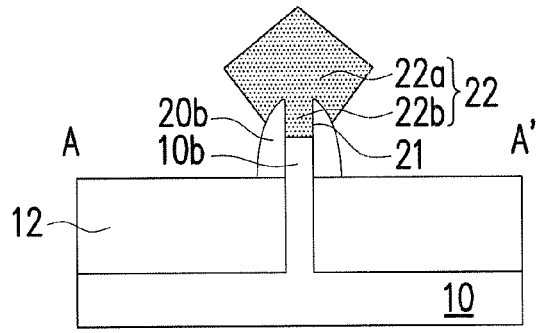

FIGS. 1, 2, 3 and 4A/4B schematically illustrate, in a perspective view (FIGS. 1 and 2) or an A-A' cross-sectional view (FIGS. 3 and 4A/4B), a method for fabricating a semiconductor device according to an embodiment of this invention, wherein FIG. 4A/4B also illustrates the resulting semiconductor device.

Figure 1:
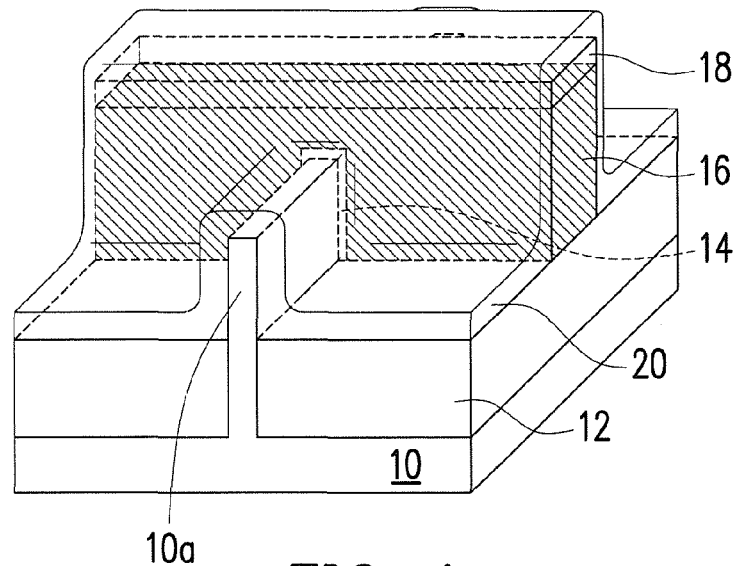

Referring to FIG. 1, a semiconductor substrate 10, such as a single-crystal silicon substrate or an epitaxial silicon substrate, is provided, and a fin structure 10a is defined from a surface part of the substrate 10. An isolation layer 12, such as a shallow trench isolation (STI) layer, is then formed on the recessed substrate 10 sandwiching a lower portion of the fin structure 10a. A gate dielectric 14, which may include silicon oxide, is formed on the surface of fin structure 10a, and then a gate conductor 16 is formed crossing over the fin structure 10a with the gate dielectric 14 therebetween. A cap layer 18, which is defined by the same mask layer for defining the gate conductor 16, is usually disposed on the gate conductor 16. The gate conductor 16 may include poly-Si. The cap layer 18 may include silicon nitride (SiN).

Thereafter, a substantially conformal spacer material layer 20 is formed over the resulting structure. The spacer material layer 20 may include SiN.

Referring to FIG. 2, anisotropic etching is performed to the spacer material layer 20 to form a first spacer 20a on the sidewall of the gate conductor 16 and a second spacer 20b on the sidewall of the fin structure 10a. A portion of the sidewall of the fin structure 10a may be exposed outside of the spacer 20b in consideration of the desired height of the fin structure 10a above the isolation layer 12 and the desired height of the spacer 20b. The height of the spacer 20b substantially determines the position of the shovel plane portion of the shovel-shaped cross section of the semiconductor layer formed in the epitaxy process later, and is preferably larger than 80 Å.

Referring to FIG. 3 in the A-A' cross-sectional view of FIG. 2, a portion of the fin structure 10a is removed to form a cavity 21 exposing a portion of an inner sidewall of the spacer 20b. That is, the cavity 21 is defined by the remaining fin structure 10b and the spacer 20b. The removal may utilize anisotropic etching or wet etching.

Referring to FIG. 4A/B, an epitaxy process is performed based on the remaining fin structure 10b to form a semiconductor layer 22. The reaction gas introduced in the epitaxy process may contains a Si source gas for Si epitaxy, and may further contain a phosphorus source gas for SiP epitaxy, or a germanium source gas for SiGe epitaxy.

The silicon source gas may be selected from the group consisting of dichlorosilane (DCS) and $SiH_4$. The phosphorus source gas may be $PH_3$. The germanium source gas may be $GeH_4$. Accordingly, the semiconductor layer 22 may include Si, SiP or SiGe. The temperature of the epitaxy process is usually higher than 500° C., preferably in the range of 675 to 725° C. The pressure of the epitaxy process is usually higher than 10 torr, preferably in the range of 275 to 325 torr. When DCS is used as the silicon source gas, the flow rate of DCS is preferably in the range of 100 to 200 sccm. When $PH_3$ is used as the phosphorus source gas, the flow rate of $PH_3$ is preferably in the range of 300 to 500 sccm.

In addition, a carrier gas, such as $H_2$, may also be introduced in the epitaxy process. An etching gas, such as HCl, may also be introduced in the epitaxy process to improve the selectivity of the epitaxy process. When HCl is used as the etching gas, the flow rate of HCl is preferably in the range of 50 to 90 sccm.

Figure 4B:
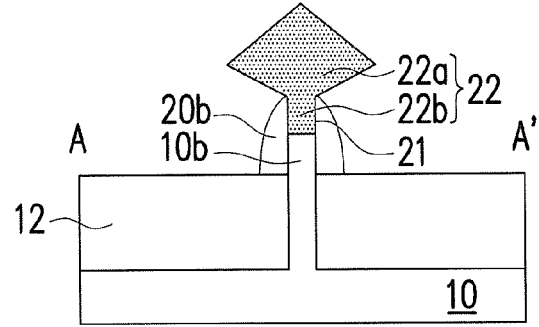

Referring to FIG. 4A/4B again, the cross section of the semiconductor layer 22 has a shovel shape, and includes a stem portion 22b in the cavity 21 and connected with the fin structure 10b, and a shovel plane portion 22a on and contiguous with the stem portion 22b. The shovel plane portion 22a may extend to cover a portion of the sidewall of the spacer 20b and define a spade shape together with the stem portion, as shown in FIG. 4A. Alternatively, the shovel plane portion 22a does not cover a portion of the sidewall of the spacer 20b and has a nearly rhombus shape, as shown in FIG. 4B. The height of the entire semiconductor layer 22 may be within the range of 250 to 450 Å. More details of the structure of the semiconductor layer 22 are described below, in reference of FIG. 5 as a locally magnified view of the structure in FIG. 4A/4B.

Figure 5:
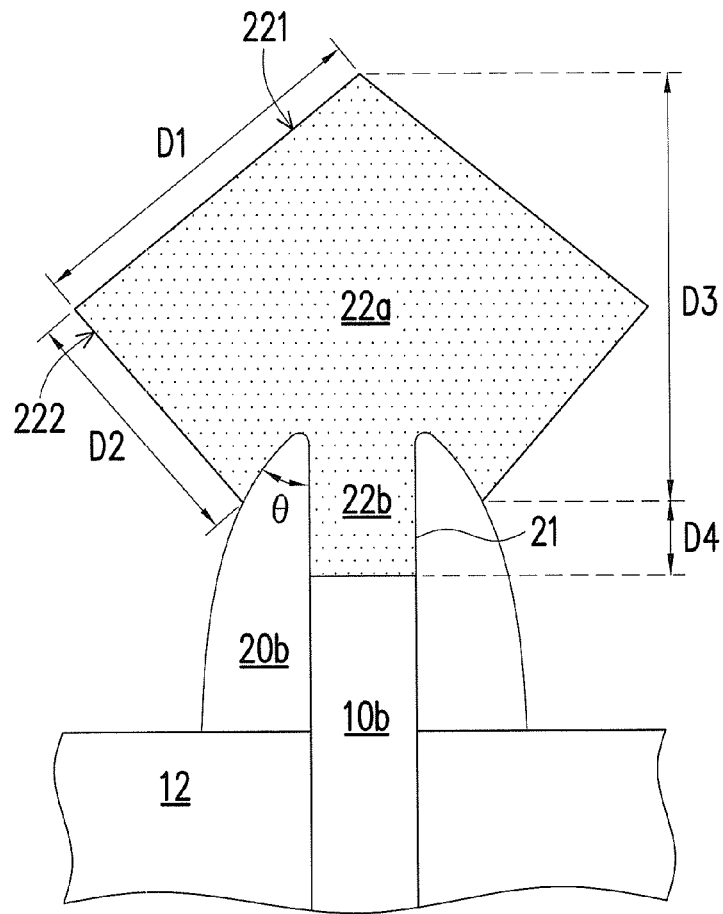
FIG. 5 is a locally magnified view of the structure in FIG. 4A/B.

Referring to FIG. 5, the shovel plane portion 22a has an upper sidewall 221 facing up, and a lower sidewall 222 facing down and connected with the upper sidewall 221. The ratio of the length D2 of the lower sidewall 222 to the length D1 of the upper sidewall 221 is larger than 0.3:1, for example.

In addition, the ratio of the height D4 of the stem portion 22b to the height D3 of the shovel plane portion 22a may be within the range of 0.1 to 1. The shovel plane portion 22a has a turning region around the top of the spacer 20b and near the spacer 20b, and the turning region has a turning angle θ within the range of 25 to 120 degrees.

Because the fin structure and the epitaxial growth of the semiconductor layer is spaced from the isolation layer by the spacer in this invention, the semiconductor layer does not easily touch the isolation layer and hence becomes more symmetric.

Moreover, when the semiconductor layer includes SiP and SiP is deposited in the epitaxy process, the growth of (110) and (111) surfaces of silicon are blocked by the spacer at an initial stage of the epitaxy, so that a dislocation in <111> direction does not easily occur.

This invention has been disclosed above in the preferred embodiments, but is not limited to those. It is known to persons skilled in the art that some modifications and innovations may be made without departing from the spirit and scope of this invention. Hence, the scope of this invention should be defined by the following claims.

What is claimed is:

1. A method for fabricating a semiconductor device, comprising:
   forming an isolation layer at both sides of a fin structure;
   forming a spacer on a sidewall of the fin structure and on a top of the isolation layer, wherein the spacer covers only a portion of a top surface of the isolation layer;
   removing a portion of the fin structure to form a cavity exposing at least a portion of an inner sidewall of the spacer; and
   performing an epitaxy process based on the remaining fin structure to form thereon a semiconductor layer that has a shovel-shaped cross section including: a stem portion in the cavity, and a shovel plane portion contiguous with the stem portion.

2. The method of claim 1, wherein a reaction gas introduced in the epitaxy process comprises a silicon source gas.

3. The method of claim 2, wherein the reaction gas further comprises a phosphorus source gas or a germanium source gas.

4. The method of claim 2, wherein a temperature of the epitaxy process is higher than 500° C.

5. The method of claim 2, wherein a pressure of the epitaxy process is higher than 10 torr.

6. The method of claim 1, wherein a height of the spacer is larger than 80 Å.

7. The method of claim 1, wherein the semiconductor layer comprises Si, SiP or SiGe.

8. The method of claim 1, wherein the spacer comprises SiN.

9. A semiconductor device, comprising:
   a fin structure;
   an isolation layer at both sides of the fin structure;
   a spacer at both sides of the fin structure and on a top of the isolation layer, defining a cavity together with the fin structure, wherein the spacer covers only a portion of a top surface of the isolation layer; and
   a semiconductor layer on the fin structure, having a shovel-shaped cross section including:
   a stem portion in the cavity and connected with the fin structure, and
   a shovel plane portion contiguous with the stem portion.

10. The semiconductor device of claim 9, wherein a height of the semiconductor layer is within a range of 250 to 450 Å.

11. The semiconductor device of claim 9, wherein a height ratio of the stem portion to the shovel plane portion is within a range of 0.1 to 1.

12. The semiconductor device of claim 9, wherein the shovel plane portion has an upper sidewall facing up, and a lower sidewall facing down and connected with the upper sidewall, and a length ratio of the lower sidewall to the upper sidewall is larger than 0.3:1.

13. The semiconductor device of claim 9, wherein the shovel plane portion has, around a top of the spacer, a turning angle within a range of 25 to 120 degrees.

14. The semiconductor device of claim 13, wherein the shovel plane portion covers a portion of a sidewall of the spacer.

15. The semiconductor device of claim 9, wherein the semiconductor layer comprises Si, SiP or SiGe.

16. A structure of a semiconductor layer, having a shovel-shaped cross section including:
   a stem portion, and
   a shovel plane portion contiguous with the stem portion, defining a spade shape together with the stem portion,
   wherein the shovel plane portion covers a portion of a sidewall of a spacer, wherein the spacer is on a sidewall of the stem portion and on a top of an isolation layer, and the spacer covers only a portion of a top surface of the isolation layer.

17. The structure of claim 16, wherein a height of the semiconductor layer is within a range of 250 to 450 Å.

18. The structure of claim 16, wherein a height ratio of the stem portion to the shovel plane portion is within a range of 0.1 to 1.

19. The structure of claim 16, wherein the shovel plane portion has an upper sidewall facing up, and a lower sidewall facing down and connected with the upper sidewall, and a length ratio of the lower sidewall to the upper sidewall is larger than 0.3:1.

20. The structure of claim 16, wherein the shovel plane portion has a turning region near the stem portion, and the turning region has a turning angle within a range of 25 to 120 degrees.

21. The structure of claim 16, wherein the semiconductor layer comprises Si, SiP or SiGe.

\* \* \* \* \*